United States Patent [19]

Matsuhiro et al.

[11] Patent Number: 5,232,907

[45] Date of Patent: Aug. 3, 1993

[54] YTTRIUM-BARRIUM-COPPER OXIDE POWDER AND PROCESS FOR MANUFACTURING YTTRIUM-BARRIUM-COPPER OXIDE SUPERCONDUCTING SINTERED BODY

[75] Inventors: Keiji Matsuhiro, Nagoya; Hitoshi Sakai, Komaki; Manabu Yoshida, Bisai, all of Japan

[73] Assignee: NGK Insulators, Ltd., Japan

[21] Appl. No.: 807,624

[22] Filed: Dec. 13, 1991

Related U.S. Application Data

[60] Division of Ser. No. 663,181, Feb. 20, 1991, abandoned, which is a continuation of Ser. No. 389,340, Aug. 3, 1989, abandoned.

[30] Foreign Application Priority Data

Aug. 12, 1988 [JP] Japan ................... 63-201658

[51] Int. Cl.$^5$ .............. C01F 11/02; C01F 17/00; C01G 3/02; H01L 39/24
[52] U.S. Cl. ...................... 505/1; 423/604; 505/725; 505/742; 505/780
[58] Field of Search ............ 505/1, 780, 742, 725; 423/604, 635

[56] References Cited

U.S. PATENT DOCUMENTS

| | | | |
|---|---|---|---|
| 4,857,504 | 8/1989 | Hermann et al. | 505/1 |
| 4,863,521 | 9/1989 | Block | 505/1 |
| 4,876,240 | 10/1989 | Ziolo | 501/123 |
| 4,886,777 | 12/1989 | Kimura et al. | 505/1 |
| 4,971,946 | 11/1990 | Taylor et al. | 505/1 |

FOREIGN PATENT DOCUMENTS

| | | |
|---|---|---|
| 63-270342 | 11/1988 | Japan . |
| 64-45763 | 2/1989 | Japan . |
| 64-61345 | 3/1989 | Japan . |
| 0160825 | 6/1989 | Japan ................... 505/780 |

OTHER PUBLICATIONS

Japan Society Powder and Powder Metall., Spring Conference, 1988, Preliminary Manuscript of Lectures.
Japan Society Power and Powder Metall., vol. 35, No. 5, Jul. 1988.
Journal of Solid State Chemistry 43, 73–80 (1982) C. Michel et B. Raveau.
De Leeuw "Compounds and Phase Compatibilities in $Y_2O_3$-$BaOCuO_m$-"*Physica* C152 Mar. 1, 1988 pp. 39–49.
Cava "Bulk Superconducting at 91k in Single Phase in $Ba_2YCu_3O_x$" *Physical Rev. Lett.*, vol. 58 (16) Apr. 20, 1987 pp. 1676–1679.
Oka "Phase Diagram and Crystal Growth of $NdBa_2Cu_3O_x$" *Jap. Jnl. Appl. Phys.* vol. 28 (2) Feb. 1989 pp. L219–L221.
Aida "Preparation of $YBa_2Cu_3O_7$ Superconducting thin films . . . " *Jap. Jnl. Appl. Phys.* vol. 26(9) Sep. 1987 pp. L1489–L1491.
Shi "Sintering of $YBa_2Cu_3O_x$ Compacts" Prepnht. submitted © PTO Mar. 22, 1988, File 00550.

*Primary Examiner*—Paul Lieberman
*Assistant Examiner*—John Boyd
*Attorney, Agent, or Firm*—Parkhurst, Wendel & Rossi

[57] ABSTRACT

An yttrium-barium-copper oxide powder consisting of a powdery mixture of $Y_2BaCuO_5$ with $Ba_3Cu_5O_8$, which can be formed into a dense sintered body having excellent superconducting characteristics. An yttrium-barium-copper oxide superconducting body is manufactured by firing the above powder preferably at 820°–980° C. under oxidizing atmosphere having an oxygen partial pressure of 0.01–0.5 atm.

5 Claims, 1 Drawing Sheet

YTTRIUM-BARRIUM-COPPER OXIDE POWDER AND PROCESS FOR MANUFACTURING YTTRIUM-BARRIUM-COPPER OXIDE SUPERCONDUCTING SINTERED BODY

This is a Division of application Ser. No. 07/663,181 filed Feb. 20, 1991, now abandoned, which is a continuation of application Ser. No. 07/389,340 filed Aug. 3, 1989, now abandoned.

BACKGROUND OF THE INVENTION

1. Field of the Invention

The present invention relates to an yttrium-barium-copper oxide powder from which a dense sintered body having an excellent superconducting characteristics is obtainable and a process for manufacturing an yttrium-barium-copper oxide superconducting sintered body by using the above powder.

2. Related Art Statement

In superconducting bodies, to heighten the critical current density that is one of the superconducting characteristics is an indispensable requirement for putting the superconducting bodies to practical use. In superconducting sintered bodies, since high densification of the sintered bodies can increase the critical current density, extensive studies for obtaining dense sintered bodies have been carried out.

Heretofore, as a manufacturing process of $YBa_2Cu_3O_7$ (oxygen nonstoichiometry omitted) super-conducting sintered bodies, there have been known (1) processes wherein a $YBa_2Cu_3O_7$ powder is synthesized and then sintered, (2) processes wherein at least two kinds of powders are mixed together and $YBa_2Cu_3O_7$ is manufactured by reaction sintering, etc.

In the above processes (1) the $YBa_2Cu_3O_7$ powder is generally obtained by mixing predetermined amounts of $Y_2O_3$ powder, $BaCO_3$ powder and $CuO$ powder, followed by calcining at 900°~950° C. in the ambient atmosphere or oxygen. Other than the above, there is a manufacturing process of $YBa_2Cu_3O_7$ comprising synthesis by a co-precipitation method of a nitrate, oxalate or the like containing a predetermined amount of Y-Ba-Cu, followed by calcination and also a process comprising a gas phase synthesis method to obtain a $YBa_2Cu_3O_7$ powder directly, etc.

The above processes (2) include a process wherein a mixture of a $Y_2BaCuO_5$ powder with one kind or more of unknown phase powders (hereinafter referred to as "A-powder") is obtained by mixing predetermined amounts of $Y_2O_3$ powder, $BaCO_3$ powder and $CuO$ powder, followed by calcining at 900°~950° C. in vacuum (under an oxygen partial pressure of $10^{-4}$ atm. or less).

In the above-described processes (1) there has been presented a problem that dense sintered bodies cannot be obtained due to a poor sintering ability of $YBa_2Cu_3O_7$. Although the densification is possible to a certain extent by providing a $YBa_2Cu_3O_7$ fine powder by a co-precipitation method, a gas phase synthesis method or the like, there have been disadvantages such as a difficulty in composition control and an extreme cost increase.

In the case of the above-described processes (2), where the mixture of a $Y_2BaCuO_5$ powder with A-powder is used, dense sintered bodies can be obtained owing to an excellent sintering property. However, A-powder has such a high reactivity with moisture, carbon dioxide and oxygen in the ambient atmosphere that difficulties have been encountered in storage and handling of A-powder.

SUMMARY OF THE INVENTION

An object of the present invention is to provide an yttrium-barium-copper oxide powder which is excellent in sintering property, low in reactivity with the ambient atmosphere and easy to manufacture, and obviates the above-described disadvantages and difficulties.

Another object of the present invention is to provide a process for manufacturing, by using the above powder, an yttrium-barium-copper oxide superconducting sintered body which is dense and excellent in superconducting characteristics.

The yttrium-barium-copper oxide powder according to the present invention is characterized by an equimolar mixture of a $Y_2BaCuO_5$ powder with a $Ba_3Cu_5O_8$ powder.

The process according to the present invention for manufacturing an yttrium-barium-copper oxide superconducting sintered body is characterized by firing an equimolar mixture of a $Y_2BaCuO_5$ powder with a $Ba_3Cu_5O_8$ powder in an oxidizing atmosphere. Here, the oxidizing atmosphere preferably has an oxygen partial pressure of 0.01~0.5 atm.

BRIEF DESCRIPTION OF THE DRAWING

The invention will now be described with reference to the accompanying drawing wherein.

DETAILED DESCRIPTION OF THE INVENTION

Figure 1:
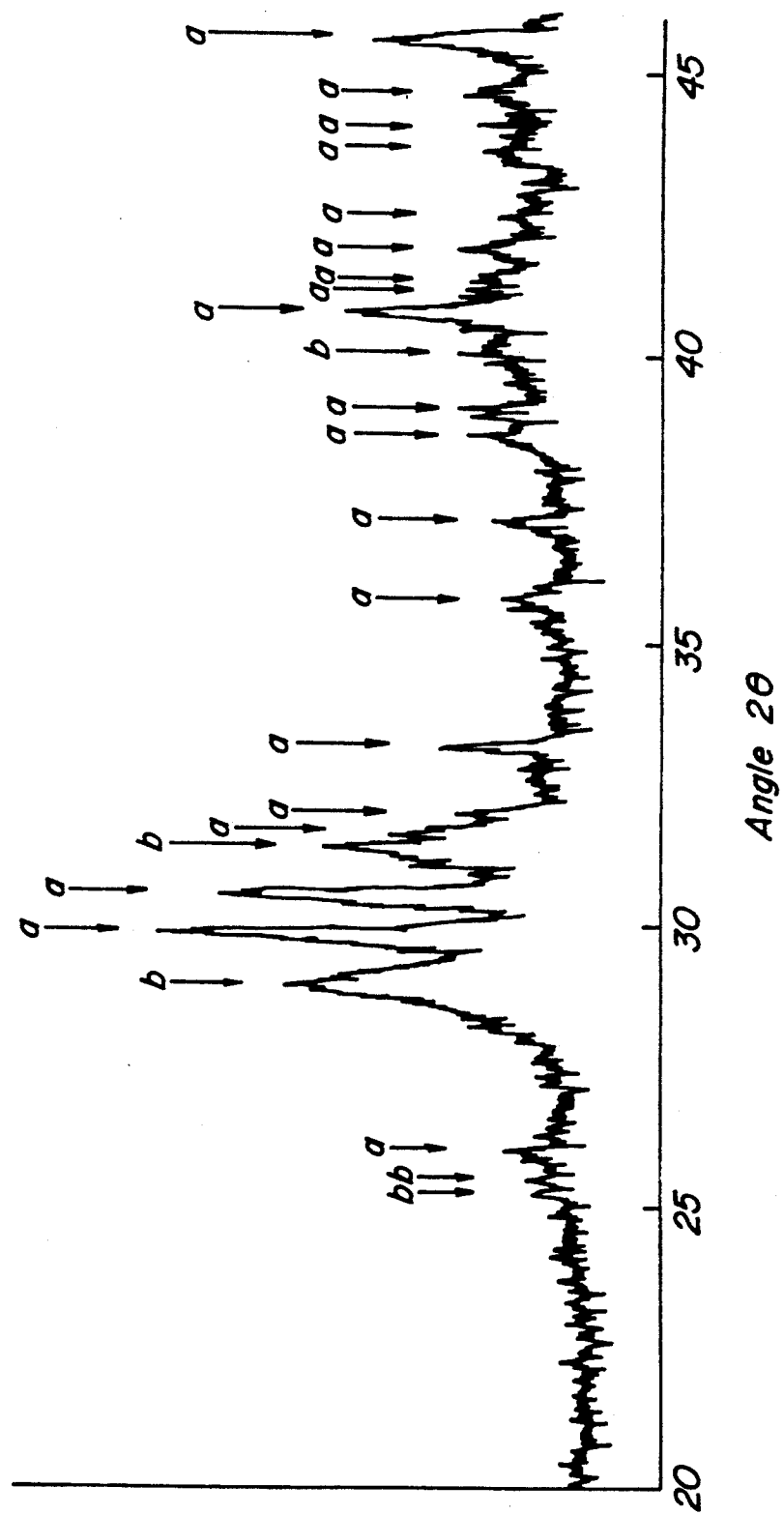
FIG. 1 is a chart showing an X-ray diffraction pattern by Cu-Kα-ray of the powder of the present invention.

In the above-described structure, although various processes are conceivable for manufacturing a mixture of $Y_2BaCuO_5$ with $Ba_3Cu_5O_8$, they are not essential in the present invention. There will be no problem either in a process wherein the $Y_2BaCuO_5$ powder and $Ba_3Cu_5O_8$ powder are prepared severally and then mixed mechanically or a process wherein a powdery mixture of $Y_2BaCuO_5$ with $Ba_3Cu_5O_8$ is directly obtained.

The $Ba_3Cu_5O_8$ powder does not exist as a stable phase under a high oxygen partial pressure such as in the air or oxygen, so that its manufacturing process necessarily comprises mixing of predetermined amounts of a $BaCO_3$ powder and a $CuO$ powder and then calcining the resultant mixture at 850°~950° C. in an atmosphere having an oxygen partial pressure of $10^{-3}$ or less, followed by a temperature decrease to 300°~500° C. and an oxygen partial pressure increase to $10^{-2}$ atm. or more.

Although the crystal structure and lattice constant of $Ba_3Cu_5O_8$ have not so far been reported, a $Ba_3Cu_5O_8$ phase could be identified by similarity of the X-ray diffraction pattern shown in FIG. 1 to X-ray diffraction patterns of $Sr_3Cu_5O_8$ and $Sr_2BaCu_5O_8$ reported by Ikeda, et al. (Jpn. Soc. Powder and Powder Metall., Spring Conference, 1988, Preliminary Manuscript of lectures, p. 31). However, the composition of oxygen was not determined precisely so that there was a possibility that the oxygen content was not exactly 8, whereas in the present invention the oxygen nonstoichiometry is not material.

It has been found from the result of assiduous studies that excellent sintering properties of the powdery mixture of $Y_2BaCuO_5$ and $Ba_3Cu_5O_8$ are attributable to the following sintering process.

$Ba_3Cu_5O_8$ decomposes at 500°~600° C. into $BaCuO_2$ and an unknown phase (B-phase). The B-phase is a CuO-rich phase and, at 820° C. or more, forms a liquid phase. The densification progresses as $Y_2BaCuO_5$ and $BaCuO_2$ reaction-sinter with the aid of this liquid phase.

The firing temperature is preferred to be 820°~980° C. This is because the liquid formation at below 820° C. will be too little for the densification to progress, while at above 980° C. $YBa_2Cu_3O_7$ will melt or decompose. More preferably it is 920°~950° C.

The reason why the firing atmosphere is defined to be an oxidizing atmosphere, preferably having an oxygen partial pressure of 0.01~0.5 atm., is because in a reducing atmosphere having an oxygen partial pressure of less than 0.01 atm., $YBa_2Cu_3O_7$ will be so unstable that $Y_2BaCuO_5$ and $BaCuO_2$ will not react with each other. Alternatively, if the oxygen partial pressure exceeds 0.5 atm., $Ba_3Cu_5O_8$ will not decompose at below 900° C. and $Y_2BaCuO_5$ reacts directly with $Ba_3Cu_5O_8$ to produce $YBa_2Cu_3O_7$, so that the liquid phase formation is too little to facilitate the densification. However, in this case if the temperature is increased to a high temperature, for example, 950° C, the densification can be achieved satisfactorily.

$Ba_3Cu_5O_8$ is inherently not in a stable phase in the atmosphere. However, it does not decompose at below 500° C. and remains stable at room temperature or thereabouts substantially without reacting with moisture, carbon dioxide and oxygen in the ambient atmosphere.

The invention will be explained hereinafter in more detail by way of example.

EXAMPLE 1

A $Y_2O_3$ powder (average particle diameter: 0.4 μm), a $BaCO_3$ powder (average particle diameter: 0.8 μm) and a CuO powder (average particle diameter: 2.5 μm), each having a purity of 99.9% were compounded at a molar ratio of 1:4:6 and then mixed for 15 hours with nylon coated steel balls in a pot-mill using water as a solvent. The mixed colution was passed through a 44 μm mesh sieve and then dried at 100° C. in a hot-air dryer. The dried powder was put into an alumina crucible and kept at 900° C. for 10 hours in nitrogen gas stream (oxygen partial pressure: $10^{-5}$ atm.) of 0.4 l/min. Then the temperature was reduced at a rate of 2° C./min. to 500° C. which temperature was kept for 1 hour, replacing the atmosphere with oxygen gas stream. Then the temperature was reduced at a rate of 2° C./min. to room temperature. The resultant calcined powder was pulverized for 20 min. with an agate mortar.

An X-ray diffraction pattern by Cu-Kα-ray of the obtained powder is shown in FIG. 1. In FIG. 1, the denotation a is a diffraction line from $Y_2BaCuO_5$, shown by C. Michel and B. Raveau in an article (C. Michel et al, J. Solid State Chem., 43, 73–80, 1982) and the denotation b is a diffraction line from $Ba_3Cu_5O_8$. According to the result of ICP spectrometry, this powder had a cation molar ratio, Y:Ba:Cu, of 1.0:2.0:3.0.

EXAMPLE 2

The powder prepared in Example 1 was left to stand for 3 days in the ambient atmosphere with a humidity of 50~80%. An X-ray diffraction measurement was conducted on the powder after standing and, however, no change in the X-ray diffraction pattern was observed. Likewise, a mixture of $Y_2BaCuO_5$ powder which had been calcined at 900° C. for 10 hours in a vacuum and A-powder was left to stand in the ambient atmosphere with a humidity of 50~80%. From a few minutes after standing, the powder changed its color from green to brown and absorbed moisture. From an X-ray diffraction pattern of the powder after standing for 1 hour, it was recognized that a majority of A-phase decomposed to $BaCO_3$ and CuO.

EXAMPLE 3

The powder prepared in Example 1 was put into a toluene solution with zirconia grinding media and pulverized and mixed for 6 hours in a pot-mill. The mixed solution was passed through a 74 μm mesh sieve and then dried. This powder had an average particle diameter of 4 μm. This powder was molded into a sample of 40mm×30mm×5mm with an iron mold and rubber-pressed under a hydrostatic pressure of 7 tons/cm$_2$. The temperature was increased at a rate of 5° C./min., kept at 920° C. and 950° C., respectively, for 3 hours and reduced at a rate of 2° C./min. The oxygen partial pressure of the atmosphere was controlled by mixing oxygen gas with nitrogen gas at an arbitrary ratio through flowmeters and monitored by a zirconia oxygen sensor at an exit port of the electric furnace. The obtained sintered body was measured for bulk density by the Archimedes'method using kerosine as a solution. With respect to the critical current density, the sample was finished into 20mm×4mm×2mm and determined by the four-terminal method in liquid nitrogen at 77° K.

The relationship between the oxygen partial pressure and the bulk density of the sintered body is shown in Table 1. As shown in Table 1, when the firing temperature was 920° C., the samples Nos. 1~5 of the present invention yielded dense sintered bodies having a bulk density of 5.6 g/cm$_3$ or more at an oxygen partial pressure of 0.01~0.5 atm., while sample No. 13 of Comparative Example, wherein the oxygen partial pressure was less than 0.01 atm. did not form $YBa_2Cu_3O_7$ at less than 0.01 atm., which showed a critical current density of 0 and had no superconducting characteristics. When the oxygen partial pressure exceeded 0.5 atm. at 920° C., densification was barely effected even in Examples of the present invention such as Samples Nos. 11 and 12. At 950° C., the bulk density exceeded 5.6 g/cm$^3$ over all oxygen partial pressures. When the oxygen partial pressure was 0.1~0.5 atm., the density was as high as 5.8 g/cm$^3$ or more.

TABLE 1

| Sample No. | Firing Temperature (°C.) | Oxygen Partial Pressure (Atm.) | Bulk Density (g/cm$^3$) | Critical Current Density (A/cm$^2$) | Remarks |
| --- | --- | --- | --- | --- | --- |
| 1 | 920 | 0.01 | 5.63 | 240 | This invention |
| 2 | 920 | 0.05 | 5.70 | 290 | This invention |
| 3 | 920 | 0.1 | 5.62 | 280 | This invention |
| 4 | 920 | 0.2 | 5.85 | 300 | This invention |
| 5 | 920 | 0.5 | 5.68 | 220 | This invention |
| 6 | 950 | 0.05 | 5.90 | 300 | This invention |
| 7 | 950 | 0.1 | 5.91 | 330 | This invention |
| 8 | 950 | 0.5 | 5.82 | 290 | This invention |
| 9 | 950 | 0.8 | 5.74 | 220 | This invention |
| 10 | 950 | 1.0 | 5.64 | 240 | This invention |
| 11 | 920 | 0.7 | 5.08 | 130 | This invention |
| 12 | 920 | 1.0 | 4.95 | 100 | This invention |
| 13 | 920 | $10^{-4}$ | 4.50 | 0 | Comparative |

TABLE 1-continued

| Sample No. | Firing Temperature (°C.) | Oxygen Partial Pressure (Atm.) | Bulk Density (g/cm³) | Critical Current Density (A/cm²) | Remarks |
| --- | --- | --- | --- | --- | --- |
| | | | | | Example |

In the foregoing Examples, only $YBa_2Cu_3O_7$ was taken up as a superconducting sintered body. Needless to say, however, those substituting another rare-earth element for Y will be able to provide sintered bodies equivalent tot he present invention, on the chemical analogy of rare-earth elements.

As explained above, since the yttrrium-barium-copper oxide powder of the present invention is a superconducting material powder that is readily densifiable and stable in the atmosphere, sintered bodies high in density and excellent in superconducting characteristics can be obtained from the above material powder according to the process of the invention.

What is claimed is:

1. A process for manufacturing a yttrium-barium-copper oxide superconducting sintered body, comprising the steps of:

forming a mixture of $Y_2BaCuO_5$ powder and single phase $Ba_3Cu_5O_8$ powder, wherein said $Y_2BaCuO_5$ and $Ba_3Cu_5O_8$ powders are present in substantially a 1:1 molar ratio; and firing said mixture at a temperature between 820° C.–980° C. in an oxidizing atmosphere having an oxygen partial pressure between 0.01 atm and 0.5 atm.

2. The process of claim 1, wherein said temperature is between 920°–950° C.

3. The process of claim 1, wherein said mixture is formed by preparing said $Y_2BaCuO_5$ and $Ba_3Cu_5O_8$ powders separately and mixing said powders mechanically.

4. The process of claim 3, wherein said $Ba_3Cu_5O_8$ powder is formed by mixing predetermined amounts of $BaCO_3$ and $CuO$ powders to form a preliminary mixture, calcining said preliminary mixture at a temperature between 850°–950° C. in an atmosphere having an oxygen partial pressure not greater than $10^{-3}$ atm, decreasing the temperature to be in a range of 300°–500° C. and adjusting the oxygen partial pressure to be not less than $10^{-2}$ atm.

5. The process of claim 1, wherein said mixture is formed directly by heat treating a mixture of $Y_2O_3$, $BaCO_3$ and $CuO$ powders.

* * * * *